United States Patent
Saito et al.

(10) Patent No.: US 6,926,452 B2
(45) Date of Patent: Aug. 9, 2005

(54) MOUNTING INFORMATION-COLLECTING DEVICE, CONNECTOR, AND MOUNTING INFORMATION-COLLECTING METHOD

(75) Inventors: Fumihiko Saito, Kawasaki (JP); Takahiro Hosokawa, Kawasaki (JP); Shinji Hiyama, Kawasaki (JP); Hiroshi Nakaide, Kawasaki (JP)

(73) Assignee: Fujitsu limited, Kawasaki (JP)

( * ) Notice: Subject to any disclaimer, the term of this patent is extended or adjusted under 35 U.S.C. 154(b) by 0 days.

(21) Appl. No.: 10/746,776

(22) Filed: Dec. 23, 2003

(65) Prior Publication Data

US 2004/0150812 A1 Aug. 5, 2004

Related U.S. Application Data

(62) Division of application No. 09/989,865, filed on Nov. 19, 2001, now Pat. No. 6,707,543, which is a continuation of application No. PCT/JP99/03570, filed on Jul. 1, 1999.

(51) Int. Cl.[7] .................................................. G02B 6/36
(52) U.S. Cl. .............................. 385/88; 385/76; 385/89; 385/92
(58) Field of Search .......................... 385/50, 88, 145, 385/76, 89, 92

(56) References Cited

U.S. PATENT DOCUMENTS

| | | | |
|---|---|---|---|
| 5,329,359 A | * | 7/1994 | Tachikawa .................. 356/398 |
| 5,383,270 A | | 1/1995 | Iwatsuka et al. |
| 5,501,005 A | | 3/1996 | Onitsuka |
| 5,761,798 A | | 6/1998 | Suzuki |
| 5,991,435 A | | 11/1999 | Tsujikawa et al. |
| 6,005,965 A | * | 12/1999 | Tsuda et al. ................. 382/145 |
| 6,176,011 B1 | | 1/2001 | Shirakawa |
| 6,199,272 B1 | | 3/2001 | Seto et al. |
| 6,506,222 B2 | | 1/2003 | Minamitani et al. |
| 6,514,787 B1 | | 2/2003 | Farnworth et al. |

FOREIGN PATENT DOCUMENTS

| | | |
|---|---|---|
| JP | 04239198 | 8/1992 |
| JP | 5-1281 U | 1/1993 |
| JP | 08016700 | 1/1996 |
| JP | 09214153 | 8/1997 |
| JP | 10221267 | 8/1998 |

* cited by examiner

*Primary Examiner*—Brian Healy
*Assistant Examiner*—Eric Wong
(74) *Attorney, Agent, or Firm*—Katten Muchin Zavis Rosenman

(57) ABSTRACT

There are disclosed a mounting information-collecting device which is capable of collecting mounting information concerning mounted statuses of circuit boards with high accuracy and efficiency, as well as a connector and a mounting information-collecting method therefor. A light-emitting device emits an optical signal. A plurality of optical signal-processing elements each apply processing to the optical signal in a manner unique to a corresponding one of the circuit boards to thereby generate a processed optical signal. A mounting information-collecting device receives the processed optical signal and detects whether or not the processing has been applied, to thereby collect the mounting information.

1 Claim, 12 Drawing Sheets

| PNa | PNd | PNg |
|-----|-----|-----|
| PNb | PNe | PNh |
| PNc | PNf | PNi |

POSITIONS OF SIGNAL-BLOCKING PANELS

FIG. 8

MOUNTING INFORMATION-COLLECTING DEVICE, CONNECTOR, AND MOUNTING INFORMATION-COLLECTING METHOD

CROSS-REFERENCE TO RELATED APPLICATION

The present application is a Divisional of U.S. application Ser. No. 09/989,865 filed on Nov. 19, 2001 now U.S. Pat. No. 6,707,543, which was is a continuation of International Application Number PCT/JP99/03570 filed on Jul. 1, 1999, now pending.

BACKGROUND OF THE INVENTION

1. Field of the Invention

The present invention relates to a mounting information-collecting device, a connector, and a mounting information-collecting method, and more particularly, to a mounting information-collecting device for collecting mounting information concerning mounted statuses of respective circuit boards by using an optical signal, a connector for connecting each circuit board to a housing, and a mounting information-collecting method of collecting the mounting information concerning the mounted statuses of the respective circuit boards by using the optical signal.

2. Description of the Related Art

When a circuit board is received in a housing, faulty mounting of the circuit board can occur e.g. due to incomplete insertion of the same into the housing. Visual confirmation by human eyes is unreliable and ineffective in finding such faulty mounting of a circuit board.

For this reason, there was proposed a device which is capable of detecting faulty mounting of a circuit board mechanically without resorting to human eyes alone for confirmation. FIG. 12 shows the arrangement of the conventional circuit board mounted status-detecting device. The conventional circuit board mounted status-detecting device 200 is comprised of a housing 201, circuit boards 202a to 202n, and a monitoring block 203.

The circuit boards 202a to 202n have respective connectors Cpa to Cpn arranged thereon, and the monitoring block 203 has a connector Cp arranged thereon. On the other hand, the housing 201 has connectors Cfa to Cfn and Cf arranged thereon in a manner corresponding to the respective connectors Cpa to Cpn and Cp. In FIG. 12, the monitoring block 203 has already been fitted into the housing 201.

The connectors Cpa to Cpn have respective contacts pa-1 to pn-1 connected to ground GND. On the other hand, the connectors Cfa to Cfn have respective contacts pa-2 to pn-2 corresponding to the contacts pa-1 to pn-1, and the contacts pa-2 to pn-2 are each pulled up by a resistor R within the monitoring block 203 via a corresponding one of signal lines Sa to Sn.

When the circuit boards 202a to 202n are fitted into the housing 201, the signal lines Sa to Sn are connected to ground GND via the contacts pa-1 to pn-1 and the contacts pa-2 to pn-2 connected respectively to each other.

Therefore, when the power is turned on after the circuit boards 202a to 202n are fitted into the housing 201, the voltage of each of the signal lines Sa to Sn arranged on a backboard of the housing 201 changes to a ground level (however, the voltage of a signal line on a portion of the housing 201 in which a circuit board is not mounted does not change to the ground level). The monitoring block 203 detects the voltage level of each of the signal lines Sa to Sn and determines, based on the detected voltage level, whether or not each of the circuit boards 202a to 202n is mounted.

However, in the above prior art, it is required to increase the number of signal lines Sa to Sn with an increase in the number of circuit boards to be mounted, which causes congestion of wiring on the backboard of the housing. Further, the number of input/output pins of a connector is limited, and hence the increase in the number of signal lines Sa to Sn results in shortage of pins of the connector of the monitoring block.

Moreover, in the prior art, although it is possible to detect whether or not a circuit board is mounted, when a mounted circuit board is suffering from a fault, it is impossible to locate the circuit board.

SUMMARY OF THE INVENTION

It is an object of the invention to provide a mounting information-collecting device which is capable of collecting mounting information concerning mounted statuses of circuit boards with high accuracy and efficiency.

It is another object of the invention to provide a connector for use in collecting mounting information concerning a mounted status of a circuit board with high accuracy and efficiency.

It is a further object of the invention to provide a mounting information-collecting method of collecting mounting information concerning mounted statuses of circuit boards with high accuracy and efficiency.

To attain the above first-mentioned object, according to a first aspect of the invention, there is provided a mounting information-collecting device for collecting mounting information concerning mounted statuses of circuit boards by using an optical signal. The mounting information-collecting device is characterized by comprising light-emitting means that emits the optical signal, optical signal-processing means that applies processing to the optical signal in a manner unique to each of the circuit boards to thereby generate a processed optical signal, and mounting information-collecting means that receives the processed optical signal and detects whether or not the processing has been applied, to thereby collect the mounting information.

To attain the above second-mentioned object, according to a second aspect of the invention, there is provided a connector for connecting a circuit board to a housing. The connector is characterized by comprising an optical filter constituted by a first optical filter portion for passing all wavelengths of an optical signal and a second optical filter portion for removing a particular wavelength specifically associated with the circuit board, an optical fiber-holding portion for holding a first optical fiber for guiding the optical signal and a second optical fiber for guiding the optical signal, such that an end face of the first optical fiber and an end face of the second optical fiber have points of contact with a light-receiving portion of the optical filter and a light-emitting portion of the optical filter, respectively, and a slider mechanism for sliding the optical filter in a front-rear direction in which the circuit board is movable, in accordance with mounting or demounting of the circuit board to or from the housing, to thereby change the points of contact.

To attain the above third-mentioned object, according to a third aspect of the invention, there is provided a mounting information-collecting method of collecting mounting information concerning mounted statuses of circuit boards by using an optical signal. The mounting information-collecting method is characterized by comprising the step of emitting the optical signal, applying processing to the optical signal in a manner unique to each of the circuit boards to thereby generate a processed optical signal, and receiving the processed optical signal and detecting whether or not the processing has been applied, to thereby collect the mounting information.

The above and other objects, features and advantages of the present invention will become apparent from the fol-

BRIEF DESCRIPTION OF THE DRAWINGS

FIG. 8 is a diagram showing respective positions of signal-blocking panels;

DESCRIPTION OF THE PREFERRED EMBODIMENTS

Figure 1:
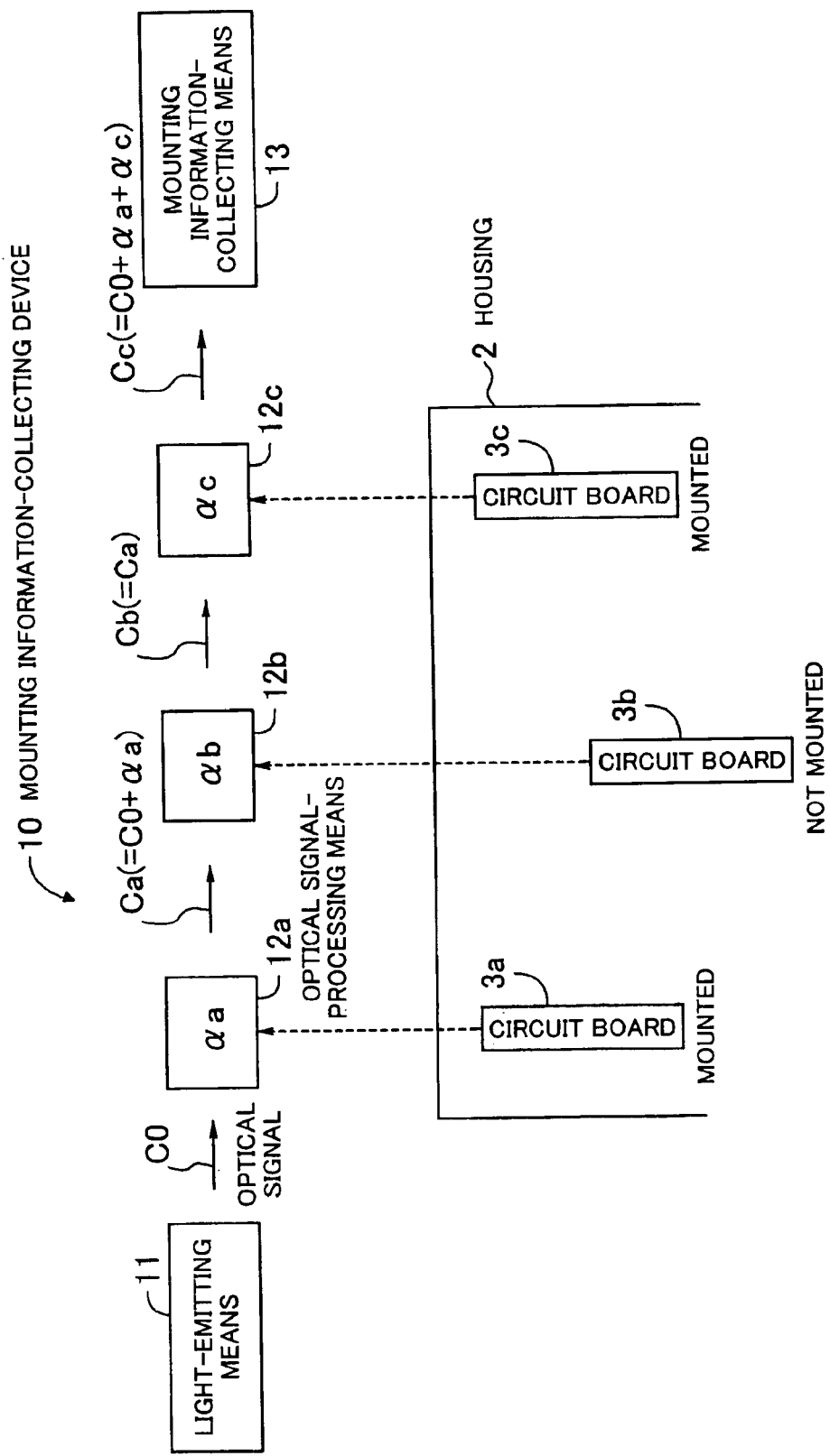
FIG. 1 is a conceptual representation showing principles of operation of a mounting information-collecting device according to the present invention.

The invention will now be described in detail with reference to drawings showing preferred embodiments thereof. FIG. 1 illustrates the principles of operation of a mounting information-collecting device according to the present invention. The mounting information-collecting device 10 collects mounting information concerning mounted statuses of respective circuit boards by using an optical signal.

Light-emitting means 11 emits the optical signal C0. Optical signal-processing means 12a to 12c each process the optical signal in a manner unique to a corresponding one of circuit boards 3a to 3c to generate a processed optical signal.

For instance, when a circuit board is mounted in a housing 2, one of the optical signal-processing means corresponding to the mounted circuit board processes the incoming optical signal. On the other hand, when a circuit board is not mounted in the housing 2, one of the optical signal-processing means corresponding to the circuit board not mounted does not process the incoming optical signal.

In the illustrated example, it is assumed that the circuit boards 3a, 3c are mounted, whereas the circuit board 3b is not mounted. Accordingly, the optical signal-processing means 12a corresponding to the circuit board 3a processes (adds $\alpha a$ to) the optical signal C0 from the light-emitting means 11 to thereby generate a processed optical signal Ca (=C0+$\alpha a$) and output the same.

The optical signal-processing means 12b corresponding to the circuit board 3b outputs a processed optical signal Cb (=Ca) without processing the processed optical signal Ca delivered from the optical signal-processing means 12a.

The optical signal-processing means 12c corresponding to the circuit board 3c processes (adds $\alpha c$ to) the processed optical signal Cb delivered from the optical signal-processing means 12b, to thereby generate a processed optical signal Cc (=C0+$\alpha a$+$\alpha c$) and output the same.

Mounting information-collecting means 13 receives the resulting processed optical signal and detects whether or not each processing has been applied to the optical signal, to thereby collect mounting information.

More specifically, in the illustrated example, the mounting information-collecting means 13 receives the optical signal Cc and recognizes that the values $\alpha a$ and $\alpha c$ have been added to the original optical signal C0 (the value of the mounting information in this case is defined e.g. as "1") and the value $\alpha b$ has not been added thereto (the value of the mounting information in this case is defined e.g. as "0") to thereby detect that the circuit boards 3a, 3c are mounted but the circuit board 3b is not mounted. Thus, the mounting information as to whether or not each of the circuit boards 3a to 3c is mounted is collected.

Figure 2:
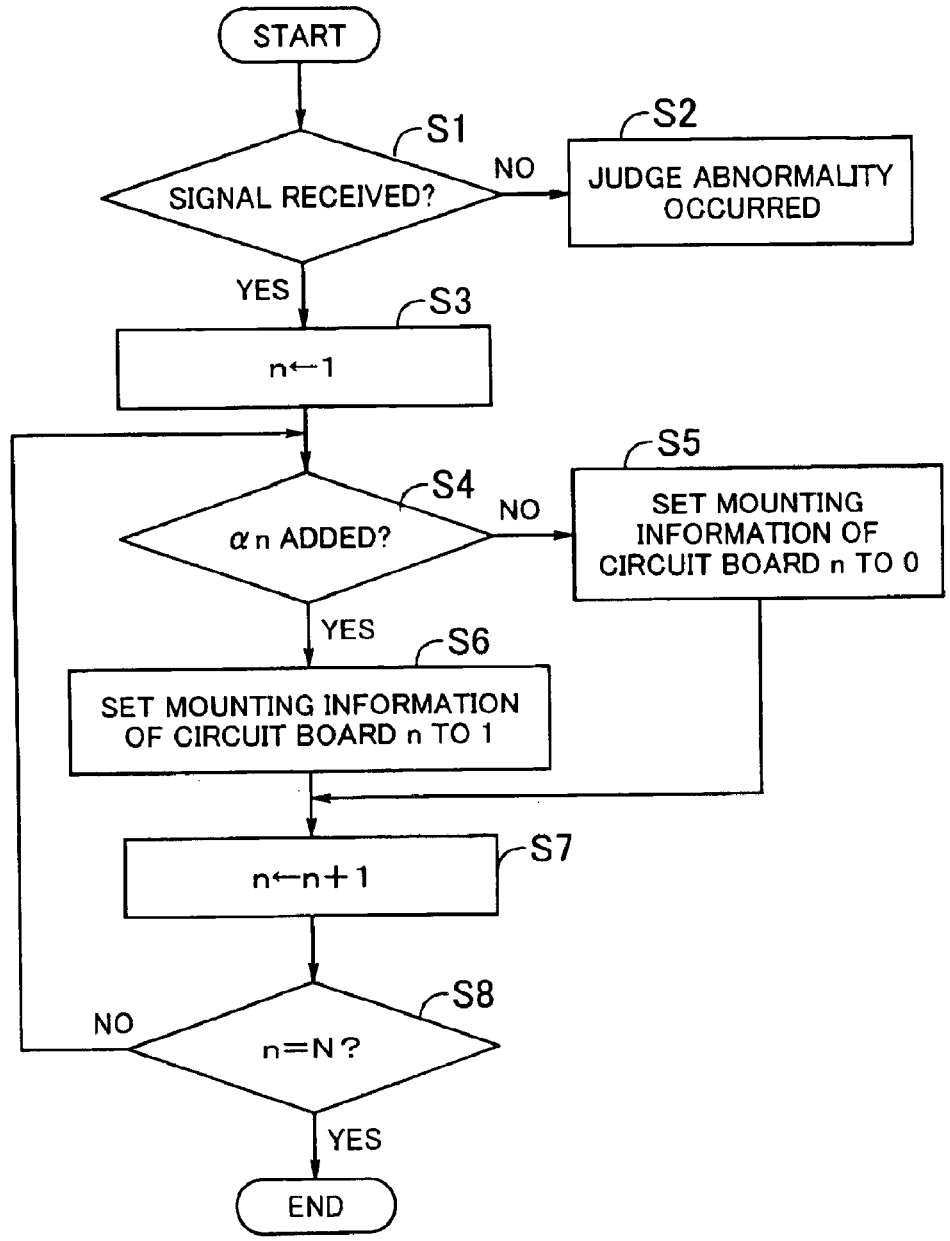
FIG. 2 is a flowchart showing a flow of operation of collecting mounting information, which is executed by the FIG. 1 mounting information-collecting device.

Next, the operation of the mounting information-collecting device 10 will be described with reference to a flowchart. FIG. 2 shows a flow of the operation of the mounting information-collecting device 10, which is performed for collecting mounting information. It is assumed here that the number of mountable circuit boards is N.

[S1] The mounting information-collecting means 13 determines whether or not an optical signal or a processed optical signal has been received. If neither of them has been received, the operation proceeds to a step S2, whereas if any of them has been received, the operation proceeds to a step S3.

[S2] The mounting information-collecting means 13 judges that there is an abnormality occurring in the light-emitting means 11 or in a light-receiving portion of the mounting information-collecting means 13.

[S3] The mounting information-collecting means 13 sets a parameter n to "1".

[S4] The mounting information-collecting means 13 determines whether or not the received optical signal has been processed to have $\alpha n$ added thereto. If the received optical signal has not been processed, the operation proceeds to a step S5, whereas if the optical signal has been processed, the operation proceeds to a step S6.

[S5] The mounting information-collecting means 13 sets the value of the mounting information concerning a circuit board n to 0 (not mounted).

[S6] The mounting information-collecting means 13 sets the value of the mounting information concerning the circuit board n to 1 (mounted).

[S7] The mounting information-collecting means 13 increments n.

[S8] The mounting information-collecting means 13 determines whether or not mounting information concerning all circuit boards has been collected. If the mounting information concerning all the circuit boards has not been collected (n≠N), the operation returns to the step S4, whereas if the mounting information concerning the same has been collected (n=N), the operation is terminated.

Figure 3:
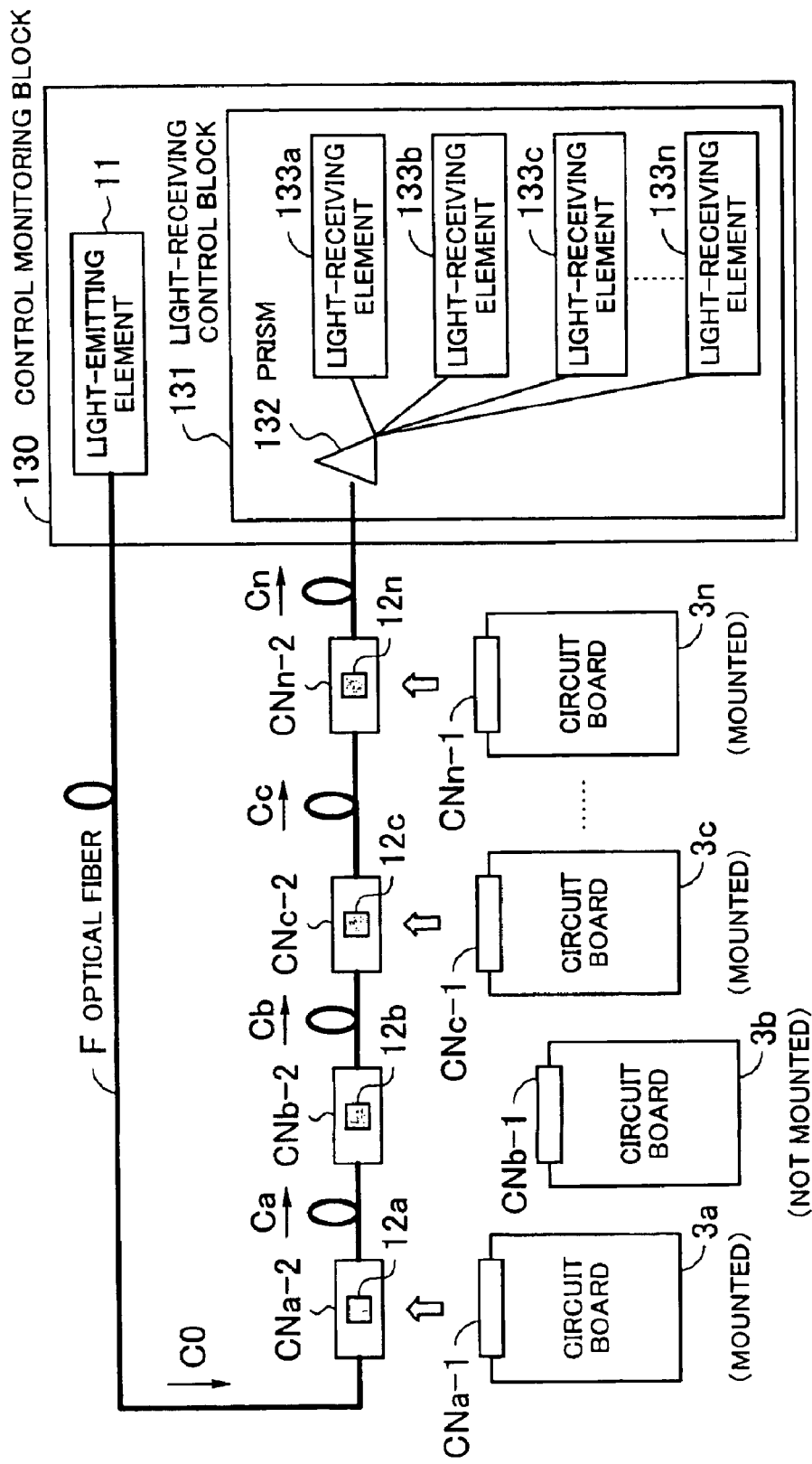
FIG. 3 is a diagram showing the arrangement of a mounting information-collecting device according to a first embodiment of the invention.

Next, description will be given of a mounting information-collecting device 10 according to a first embodiment of the invention. FIG. 3 shows the arrangement of the mounting information-collecting device 10 of the first embodiment.

Circuit boards 3a to 3n have respective connectors CNa-1 to CNn-1 arranged thereon. Connectors CNa-1 to CNn-1 arranged in a housing, not shown, for connection with the respective connectors CNa-2 to CNn-2 have respective optical filters (corresponding to the optical signal processing means) 12a to 12n arranged therein. The optical filters 12a to 12n are connected to each other via an optical fiber F serving as an optical waveguide.

The optical fiber F has one end thereof connected to a light-emitting element (corresponding to the light-emitting means) 11 within a control monitoring block 130 and the other end thereof connected to a light-receiving control block 131 within the same.

The optical signal C0 emitted from the light-emitting element 11 is an optical signal into which are multiplexed wavelengths (wavelength ranges) corresponding in number to the number of the circuit boards or more wavelengths (C0=Σλn). The optical filter 12a removes only a wavelength λa from a received optical signal when the circuit board 3a is mounted (i.e. when the connector CNa-1 has been fitted to the connector CNa-2), whereas when the circuit board 3a is not mounted, the optical filter 12a passes the optical signal C0 therethrough without processing the same.

The optical filter 12b removes only a wavelength λb from the received optical signal when the circuit board 3b is mounted (i.e. when the connector CNb-1 has been fitted to the connector CNb-2), whereas when the circuit board 3b is not mounted, the optical filter 12b passes the processed optical signal from the optical fiber 12a without processing the same.

The optical filter 12c removes only a wavelength λc from the received optical signal when the circuit board 3c is mounted (i.e. when the connector CNc-1 has been fitted to the connector CNc-2), whereas when the circuit board 3c is not mounted, the optical filter 12c passes the processed optical signal from the optical fiber 12b without processing the same. Then, the following filters 12d to 12n each carry out similar processing.

Let it be assumed that the circuit boards 3a and 3c to 3n are mounted and that the circuit board 3b alone is not mounted. In this case, a processed optical signal Ca from the optical filter 12a (that removes only the wavelength λa) is equal to Σλn−λa. Further, since the circuit board 3b is not mounted, a processed optical signal Cb from the optical filter 12b is equal to Ca.

Still further, a processed optical signal Cc from the optical filter 12c (that removes only the wavelength λc) is equal to Σλn−λa−λc. Then, the following optical filters 12d to 12n each perform a similar filtering process, and a processed optical signal Cn (Cn=λb) is outputted from the optical filter 12n.

The light-receiving control block 131 splits the processed optical signal Cn by a prism 132 into optical beams having wavelengths λa to λn which are to be received by light-receiving elements 133a to 133n, respectively. In the present example, the wavelengths λa and λc to λn of the optical signal have been removed by the optical filters 12a and 12c to 12n, respectively. Accordingly, the light-receiving elements 133a and 133c to 133n cannot receive light, but only the light-receiving element 133b receives the optical beam having the wavelength λb.

The reception of an optical beam having a particular wavelength by a corresponding one of the light-receiving elements makes it possible to recognize that a circuit board corresponding to the wavelength is not mounted. Thus, mounting information concerning the circuit boards can be obtained.

Figure 4:
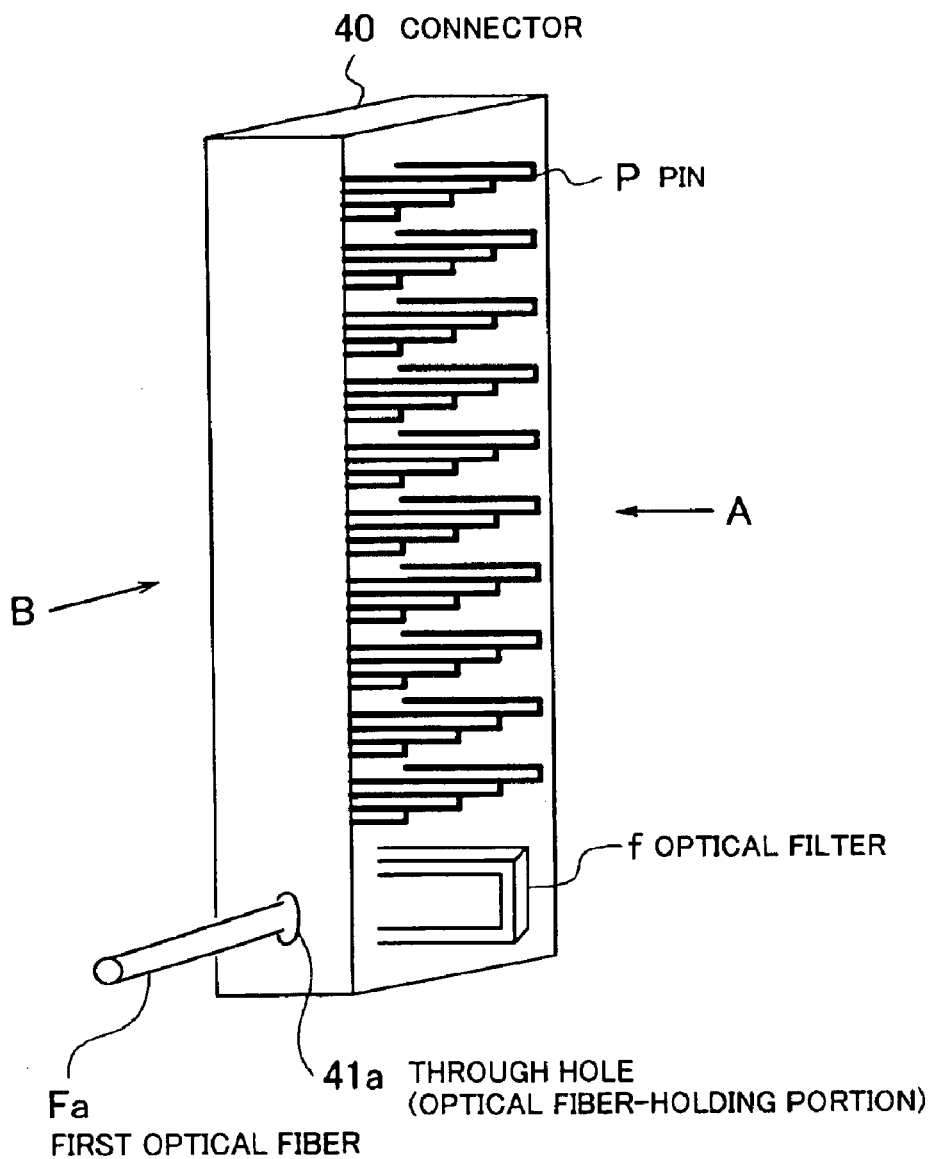
FIG. 4 is a perspective view showing the construction of a connector.
Figure 5:
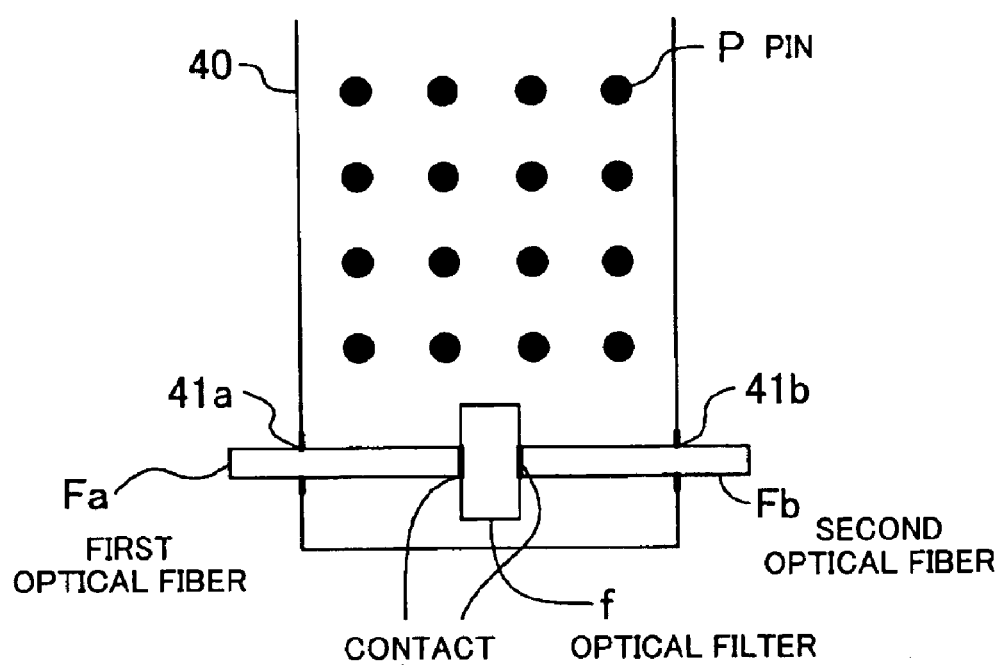
FIG. 5 is a view schematically showing essential parts of the FIG. 4 connector as viewed from a direction indicated by an arrow A in FIG. 4.
Figure 6:
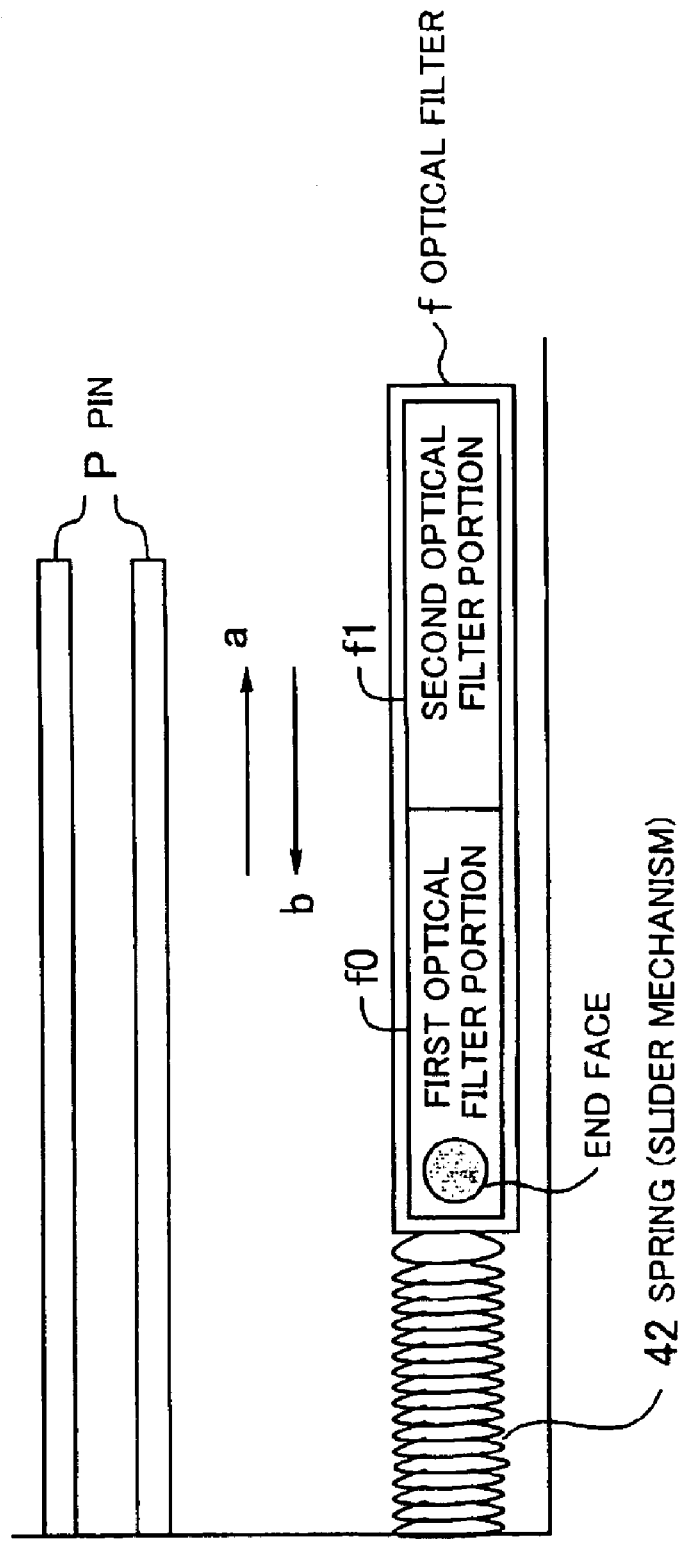
FIG. 6 is a view schematically showing the essential parts of the FIG. 4 connector as viewed from a direction indicated by an arrow B in FIG. 4.

Next, the construction of each of the connectors CNa-2 to CNn-2 (hereinafter generically referred to as "the connector 40") arranged in the housing will be described with reference to FIGS. 4 to 6. FIG. 4 shows the construction of the connector 40. FIG. 5 shows the connector 40 as viewed from a direction indicated by an arrow A in FIG. 4, while FIG. 6 shows the same as viewed from a direction indicated by an arrow B in FIG. 4.

The connector 40 has pins P fixedly arranged thereon for insertion into a connector, not shown, arranged in a corresponding circuit board, and an optical filter f arranged blow the pins P. The optical filter f is comprised of a first optical filter portion f0 for passing all wavelengths of light and a second optical filter portion f1 for removing only a particular wavelength specifically associated with the corresponding circuit board.

Further, the connector 40 has opposite side walls formed with respective through holes (corresponding to an optical fiber-holding portion) 41a, 41b through which optical fibers extends, respectively. The first optical fiber Fa and the second optical fiber Fb are fixedly arranged through the through holes 41a, 41b in a manner sandwiching the optical filter f.

More specifically, the first optical fiber Fa extending in a manner projecting into the connector 40 through the through hole 41a formed in one of the side walls of the connector 40 is fixedly arranged such that a light-receiving portion (optical signal-receiving surface) of the optical filter f and an end face of the first optical fiber Fa have a point of contact therebetween.

On the other hand, the second optical fiber Fb extending in a manner projecting into the connector 40 through the through hole 41b formed in the other side wall of the connector 40 is fixedly arranged such that a light-emitting portion (optical signal-emitting surface) of the optical filter f and an end face of the second optical fiber Fb have a point of contact therebetween.

At the location below the pins P, there is arranged a spring (corresponding to a slider mechanism) 42, and the optical filter f is attached to one end of the spring 42. When the corresponding circuit board is not mounted in the housing, the optical filter f is urged by the spring 42 to slide in a direction indicated by an arrow a in FIG. 6, and hence the end face of the first optical fiber Fa and that of the second optical fiber Fb have respective points of contact with the first optical filter portion f0.

In this case, since the first optical filter portion f0 which passes all the wavelengths removes no wavelength, an optical signal received from the first optical fiber Fa is delivered to the second optical fiber Fb without being processed at all.

On the other hand, when the corresponding circuit board is mounted, the optical filter f is urged against the spring 42 to slide in a direction indicated by an arrow b in FIG. 6, and hence the end face of the first optical fiber Fa and that of the second optical fiber Fb have respective points of contact with the second optical filter portion f1. In this case, since the second optical filter portion f1 removes only a particular wavelength specifically associated with the corresponding circuit board, an optical signal with the particular wavelength removed therefrom is delivered to the second optical fiber Fb. The provision of connectors 40 constructed as above makes it possible to eliminate congestion of wiring on the backboard of the housing, shortage of connector pins and other inconveniences, and detect the mounted/unmounted status of each circuit board with efficiency.

Figure 7:
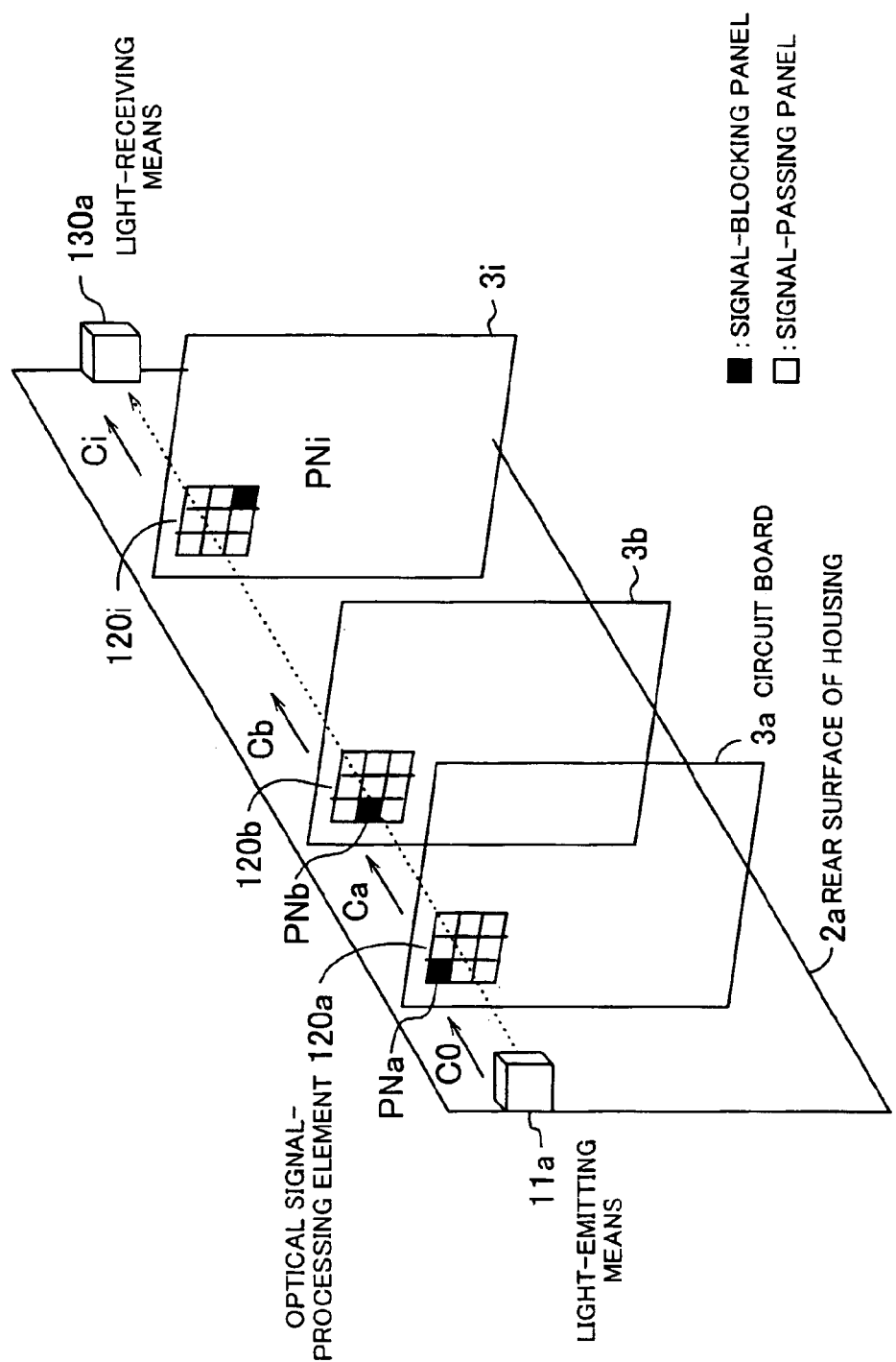
FIG. 7 is a perspective view schematically showing the arrangement of a mounting information-collecting device according to a second embodiment of the invention.

Next, a mounting information-collecting device 10 according to a second embodiment will be described. FIG. 7 shows the construction of the device 10.

Circuit boards 3a to 3i are fitted in a rear surface 2a of a housing. On one end portion of the rear surface 2a of the housing, there is arranged light-emitting means 11a, and on the other end portion of the same, there is arranged light-receiving means 130a.

The light-emitting means 11a is formed by an element which emits an optical beam, such as a laser beam, which has a directional property but not a diffusing property. Further, in the second embodiment, the air serves as an optical waveguide.

The circuit boards 3a to 3i have respective optical signal-processing elements 120a to 120i arranged therein which function as optical signal-processing means for processing an optical signal in respective cutoff patterns which are different from each other.

The optical signal-processing elements 120a to 120i are each comprised of one signal-blocking panel (black square portion in FIG. 7) for blocking an optical signal and a plurality of signal-passing panels (white square portions in FIG. 7) for passing the optical signal therethrough (the total number of the signal-blocking panel and signal-passing panels is equal to or larger than the number of the circuit boards). The position of each signal-blocking panel varies with the type of a circuit board. FIG. 8 shows the position of each signal-blocking panel. The signal-blocking panels corresponding to the respective circuit boards 3a to 3i are designated by reference numerals PNa to PNi and positioned as shown in FIG. 8.

Next, description will be given of the operation of the mounting information-collecting device 10 according the second embodiment. First, an optical signal C0 emitted from the light-emitting means 11a hits the optical signal-processing element 120a of the first circuit board 3a. The optical signal-processing element 120a blocks only an optical signal portion which hits the signal-blocking panel PNa, thereby generating a processed optical signal Ca.

The optical signal-processing element 120b of the following circuit board 3b blocks only an optical signal portion which hits the signal-blocking panel PNb, thereby generating a processed optical signal Cb. Similar processing is carried out by each of the optical signal-processing elements 120c et seq., and finally, a processed optical signal Ci is generated by the optical signal-processing element 120i. The light-receiving means 130a receives the processed optical signal Ci.

Figure 9:
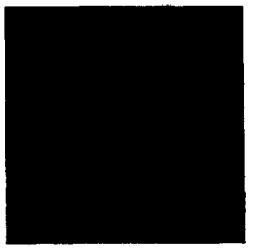
FIG. 9 is a diagram showing light-receiving patterns.
Figure 9:
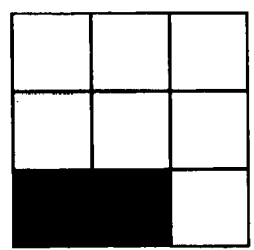
Figure 9:
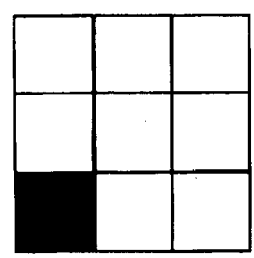
Figure 9:
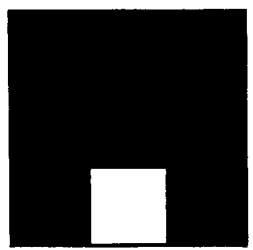

FIG. 9 shows light-receiving patterns. The processed optical signal Ca generated by the optical signal-processing element 120a of the circuit board 3a forms a pattern A, and the processed optical signal Cb generated by the optical signal-processing element 120b of the circuit board 3b forms a pattern B. Similarly, the processed optical signal Ci generated by the optical signal-processing element 120i of the circuit board 3i forms a pattern I.

In short, the pattern I indicates that the circuit boards 3a to 3i are all mounted. Thus, each mounted or unmounted circuit board can be detected. For example, if the circuit board 3b alone is not mounted, the processed optical signal Ci forms a pattern Ba.

Figure 10:
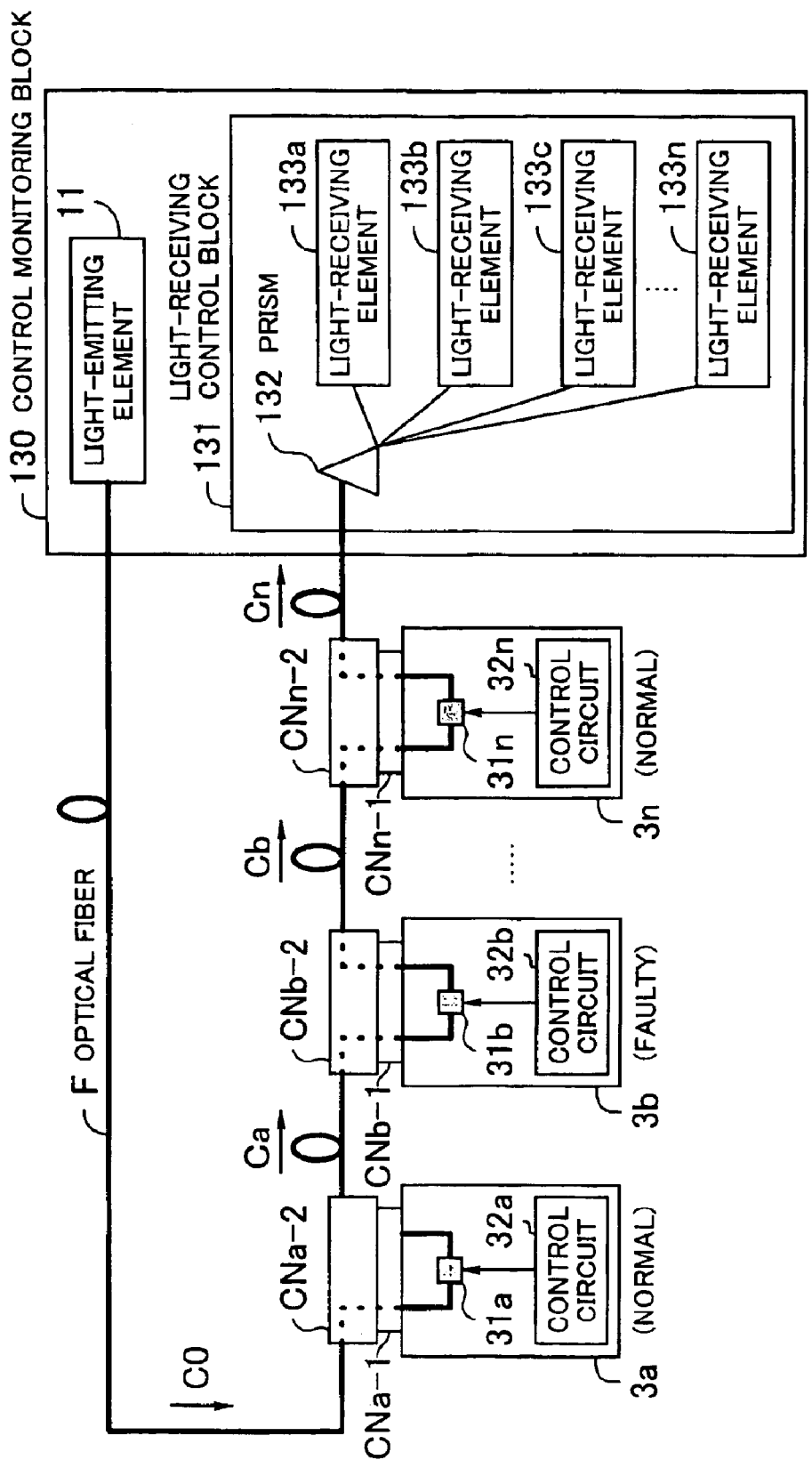
FIG. 10 is a diagram showing the arrangement of a mounting information-collecting device according to a third embodiment of the invention.

Next, description will be given of a mounting information-collecting device 10 according to a third embodiment of the invention. FIG. 10 shows the whole arrangement of the mounting information-collecting device 10 of the third embodiment.

Circuit boards 3a to 3n have respective connectors CNa-1 to CNn-1 fixed thereto. The connectors CNa-1 to CNn-1 are inserted in respective connectors CNa-2 to CNn-2 arranged in a housing, not shown (i.e. the circuit boards 3a to 3n are mounted in the housing).

The circuit boards 3a to 3n are provided with respective controllable optical filters 31a to 31n and respective control circuits 32a to 32n. The controllable optical filters 31a to 31n are optical filters of a type which can be controlled by an electric signal. Each of the controllable optical filters 31a to 31n performs wavelength filtering of an optical signal based on an electric signal (voltage or the like) delivered from a corresponding one of the control circuits 32a to 32n. The control circuits 32a to 32n each transmit the electric signal for operating a corresponding one of the controllable optical filters 31a to 31n.

For example, when receiving an electric signal from the control circuit 32a, the controllable optical filter 31a arranged in the circuit board 3a removes light having a wavelength λa. Similarly, when receiving an electric signal from the control circuit 32b, the controllable optical filter 31b arranged in the circuit board 3b removes light having a wavelength λb. The following controllable optical filters 31c to 31n operate similarly to the controllable optical filters 31a, 31b.

The control circuits 32a to 32n each deliver a predetermined electric signal to a corresponding one of the controllable optical filters 31a to 31n when the corresponding circuit board is operating normally, whereas when the circuit board is not operating normally due to a fault, the predetermined electric signal is not delivered to the controllable optical filter.

An optical fiber F extends through the connectors CNa-1 to CNn-1 and CNa-2 to CNn-2, and the controllable optical filters 31a to 31n are connected to each other via the optical fiber F in daisy chain fashion. The optical fiber F has one end thereof connected to a light-emitting element 11 within a control monitoring block 130 and the other end thereof connected to a light-receiving control block 131 within the same.

An optical signal C0 emitted from the light-emitting element 11 is an optical signal into which are multiplexed wavelengths corresponding in number to the number of the circuit boards or more wavelengths (C0=Σλn). In the illustrated example, it is assumed that the circuit boards 3a and 3c to 3n are operating normally, and the circuit board 3b is suffering from a fault.

In this case, a processed optical signal Ca from the controllable optical filter 31a (that removes the wavelength λa alone) is equal to Σλn−λa. Further, since the circuit board 3b is faulty, the control circuit 32b delivers no electric signal. Therefore, the controllable optical filter 31b outputs a processed optical signal Cb (=Ca) without executing a predetermined filtering process (that remove the wavelength λb alone).

Since the circuit boards 3c et seq. are operating normally, the controllable optical filters 32c to 32n each perform a predetermined filtering process, and finally a processed optical signal Cn (Cn=λb) is outputted from the controllable optical filter 32n.

In the light-receiving control block 131, the processed optical signal Cn is split by a prism 132 into optical beams having wavelengths λa to λn, which are to be received by light-receiving elements 133a to 133n respectively. In the present example, the wavelengths λa and λc to λn of the optical signal are removed by the controllable optical filters 31a and 31c to 31n, respectively, so that the light-receiving elements 133a and 133c to 133n cannot receive any beams, but only the light-receiving element 133b receives the beam of the wavelength λb.

Thus, the reception of a beam having a particular wavelength by a corresponding one of the light-receiving elements 133a to 133n makes it possible to recognize that a circuit board corresponding to the beam is faulty. Thus information as to whether each mounted circuit board is normal or abnormal can be obtained.

Figure 11:
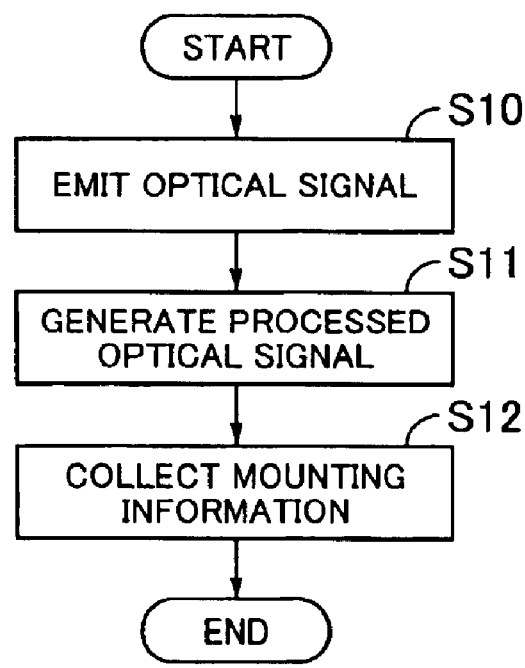
FIG. 11 is a flowchart showing a procedure of processing by a mounting information-collecting method of the invention.
Figure 12:
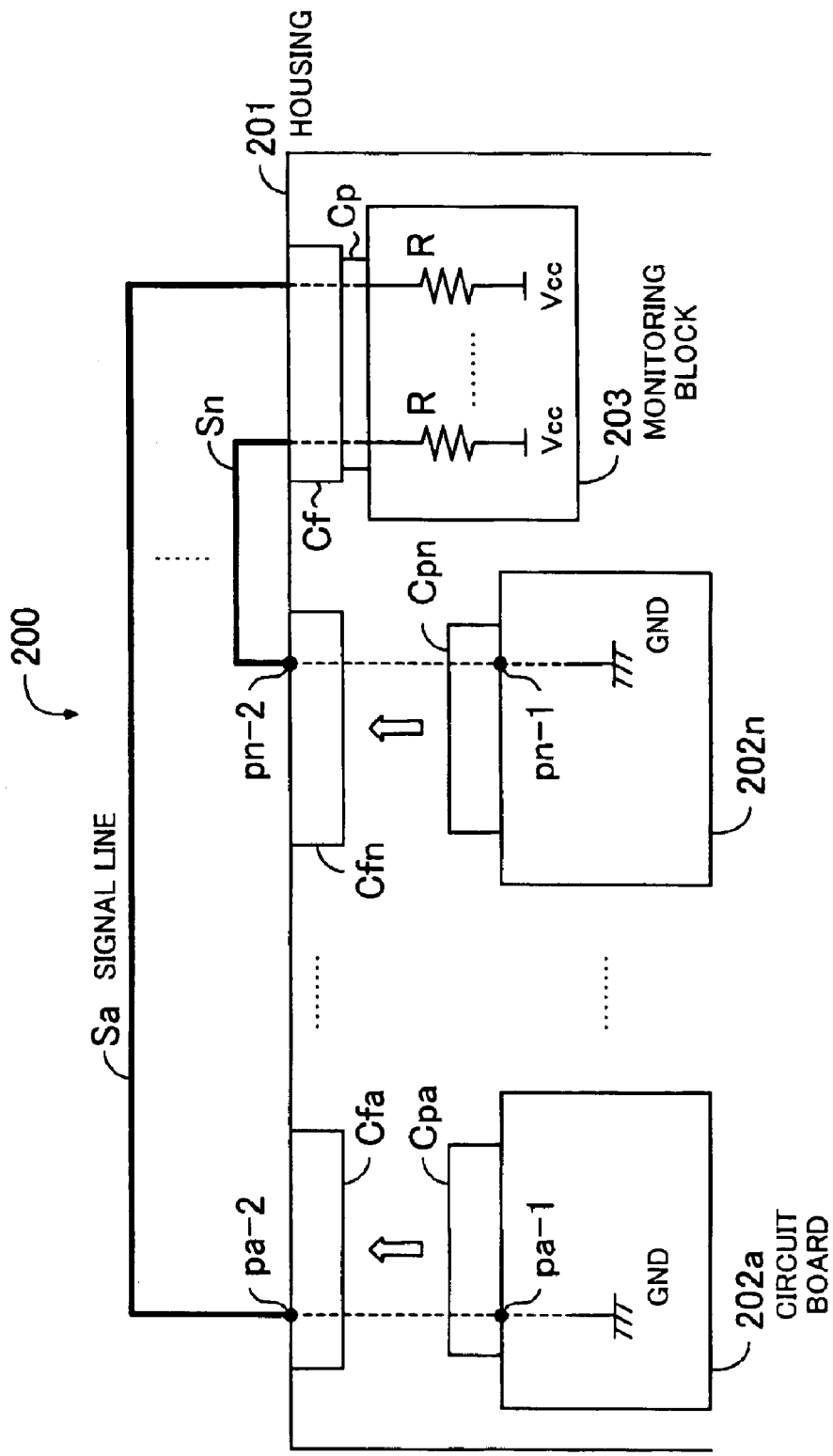
FIG. 12 is a diagram showing the arrangement of a conventional circuit board mounted status-detecting device.

Next, a mounting information-collecting method of the present invention will be described. FIG. 11 shows the procedure of processing by the mounting information-collecting method.

[S10] An optical signal is emitted.

[S11] Processing is applied to the optical signal in a manner unique to each circuit board to thereby generate a processed optical signal.

[S12] The processed optical signal is received, and then it is detected from the received processed optical signal whether or not the processing has been applied to the optical signal, to thereby collect mounting information.

In the processing applied to the optical signal, when a circuit board is not mounted, all the wavelengths of the optical signal are allowed to pass, whereas when a circuit board is mounted, only a particular wavelength of the optical signal specifically associated with the mounted circuit board is removed.

Further, it is possible to use an optical signal having a directional property but no diffusing property and process the optical signal such that a cutoff pattern varies with the type of a circuit board.

Moreover, it is possible to process an optical signal by applying a filtering process to each wavelength of the optical signal based on an electric signal delivered from a corresponding one of circuit boards, to thereby obtain information as to whether each circuit board is normal or faulty.

As described above, according to the mounting information-collecting device 10 and mounting information-collecting method of the invention, an optical signal is processed in a manner unique to each circuit board to generate a processed optical signal, and then it is detected from the processed optical signal whether or not the processing has been applied to the optical signal, whereby mounting information concerning each circuit board is collected.

This prevents an increase in the number of circuit boards from causing shortage of connector pins. Further, in the prior art, further wiring on the backboard of the housing is required as the number of circuit boards increases, resulting in congestion of the wiring, which makes static binary mounting information (indicative of whether a circuit board is mounted or not mounted) susceptible to influences (such as cross talk) from a clock, data, etc. which are external to the information and change periodically.

On the other hand, in the present invention, since an optical signal is used as static binary information, it is possible to eliminate influences from a clock, data, etc. external to the information.

Further, the present invention makes it possible to obtain mounting information based on whether or not an optical signal has been received, without using an optical modulation method or the like, which contributes to simplification of the construction of the device.

Further, since each optical filter is arranged not on a circuit board to be mounted, but in a connector, it is not required to add an extra circuit onto the circuit board.

Still further, the use of a controllable optical filter which can be controlled by an electric signal makes it possible to collect information as to whether or not each circuit board is faulty.

Conventionally, a housing formed by a stack of racks necessitates provision of numerous wires, and hence a control monitoring block is provided for each of the racks to collect mounting information of circuit boards in the rack, and then the mounting information collected by each control monitoring block is sent to a control monitoring block for the whole housing.

In contrast, according to the present invention, provision of an optical fiber extending through all racks of a housing makes it possible to collect mounting information concerning all circuit boards by a single control monitoring block provided for the whole housing.

According to the mounting information-collecting device of the present invention, an optical signal is processed in a manner unique to each circuit board to generate a processed optical signal, and then it is detected from the processed optical signal whether or not the processing has been applied to the optical signal, whereby mounting information concerning each circuit board is collected. This makes it possible to eliminate congestion of wiring on the backboard of the housing, shortage of connector pins and other problems, and detect the mount/unmounted status of each circuit or a faulty circuit board with efficiency.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A connector for connecting a circuit board to a housing, comprising:

an optical filter having a first optical filter portion for passing all wavelengths of an optical signal, when the circuit board is not connected to the housing and a second optical filter portion for removing a particular wavelength specifically associated with the circuit board, when the circuit board is connected to the housing;

an optical fiber-holding portion for holding a first optical fiber for guiding the optical signal and a second optical fiber for guiding the optical signal, such that an end face of said first optical fiber and an end face of said second optical fiber have points of contact with a light-receiving portion of said optical filter and a light-emitting portion of said optical filter, respectively, and a slider mechanism for sliding said optical filter in a front-rear direction in which the circuit board is movable, in accordance with mounting or demounting of the circuit board to or from the housing, to thereby change the points of contact.

* * * * *